United States Patent [19]

Ikegaya et al.

[11] Patent Number: 5,314,570

[45] Date of Patent: May 24, 1994

[54] PROCESS AND APPARATUS FOR THE PRODUCTION OF DIAMOND

[75] Inventors: Akihiko Ikegaya; Naoji Fujimori, both of Itami, Japan

[73] Assignee: Sumitomo Electric Industries Ltd., Osaka, Japan

[21] Appl. No.: 838,726

[22] PCT Filed: Jul. 17, 1991

[86] PCT No.: PCT/JP91/00955

§ 371 Date: Mar. 13, 1992

§ 102(e) Date: Mar. 13, 1992

[87] PCT Pub. No.: WO92/01828

PCT Pub. Date: Jun. 2, 1992

[30] Foreign Application Priority Data

Jul. 18, 1990 [JP] Japan ............................ 2-187962
Jul. 17, 1991 [JP] Japan ............................ 3-176762

[51] Int. Cl.$^5$ ............................................ C30B 25/00
[52] U.S. Cl. ........................................ 117/103; 423/446; 118/724; 117/929
[58] Field of Search ....... 156/610, 612, 613, DIG. 68; 423/446; 118/724

*Primary Examiner*—Olik Chaudhuri
*Assistant Examiner*—Felisa Garrett
*Attorney, Agent, or Firm*—Wenderoth, Lind & Ponack

[57] ABSTRACT

The present invention aims at improving a hot filament CVD method and apparatus capable of enlarging the diamond-forming area in relatively easy manner and utilizing effectively the capacity of a thermoelectron radiation material and provides a process and apparatus for producing diamond with excellent productivity as well as a compact size of apparatus, which can be applied to production on a commercial scale. The feature of the present invention consists in subjecting to decomposition, excitation and activation by a thermoelectron radiation material heated at a high temperature a raw material gas comprising at least one carbon source selected from the group consisting of hydrocarbons, hydrocarbons containing oxygens and/or nitrogens in the bonded groups, carbon oxides, halogenated hydrocarbons and solid carbon, hydrogen and optionally any one of inert gases of Group VIII elements, $H_2O$, $O_2$ and $F_2$ and depositing diamond on the surface of a substrate provided near the thermoelectron radiation material, characterized by surrounding the circumference of the thermoelectron radiation material by a cooling plate, providing a substrate to be deposited with diamond between the cooling plate and the thermoelectron radiation material with small gaps and controlling the surface temperature of the substrate facing the thermoelectron radiation material by the cooling plate and optionally a buffer material inserted between the cooling plate and the substrate, thereby depositing diamond.

14 Claims, 8 Drawing Sheets

FIG. 2(b)
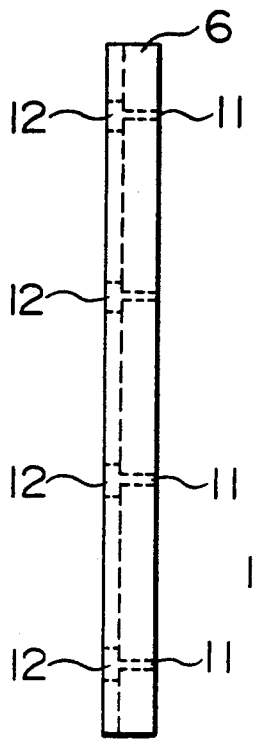
FIG. 2(c)
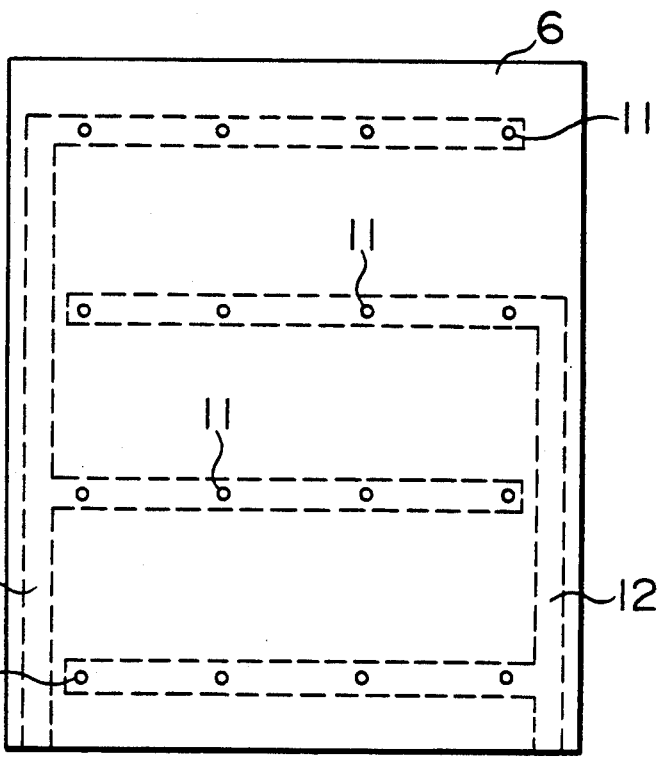
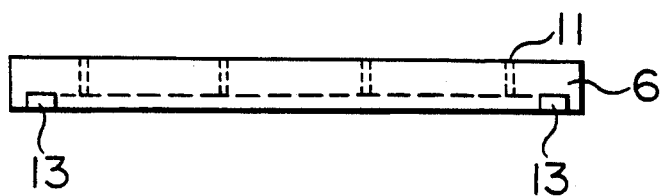
FIG. 2(d)

PROCESS AND APPARATUS FOR THE PRODUCTION OF DIAMOND

TECHNICAL FIELD

This invention relates to an improvement relating to a process for the production of diamond by gaseous phase synthesis method and an apparatus for practicing the same.

TECHNICAL BACKGROUND

In the gaseous phase synthesis of diamond, a number of methods have been developed, for example, a hot filament CVD method comprising utilizing a thermoelectron radiation material heated at a high temperature to decompose and activate a raw material gas, a microwave plasma CVD method comprising utilizing microwave plasma, a DC plasma CVD method comprising utilizing DC plasma, a dia-jet method comprising utilizing a DC plasma torch, a burner method comprising utilizing an oxygen-acetylene combustion flame, etc. Above all, the hot filament CVD method and the microwave plasma CVD method are typical methods.

According to the hot filament CVD method comprising utilizing a thermoelectron radiation material heated at a high temperature to decompose and activate a raw material gas, it is possible to enlarge a coating zone by designing the shape of a filament more readily than in the other plasma utilizing process. Even if the thermoelectron radiation material, as an exciting source, is enlarged, however, the ordinary apparatus construction is so composed that a substrate is arranged on one plane to face the thermoelectronic emission material and the utilization efficiency of the space relative to the thermoelectron radiation material is low so that the diamond-forming area is markedly limited relatively to the capacity of the exciting source. Since the size of the thermoelectron radiation material is generally smaller relatively to the size of a reaction vessel and diamond is formed only in the vicinity of the thermoelectron radiation material, the dead zone in a reaction vessel is large and the diamond-forming area is small relatively to the occupied area of the apparatus, so that the apparatus is not suitable for use as a production apparatus on a commercial scale. The flow of a raw material gas is governed by convection and is not simple near the thermoelectron radiation material because of using a reaction pressure of several ten to several hundred Torr and accordingly, effective feeding of the raw material gas and exhausting of the reacted gas cannot well be carried out.

In the hot filament CVD method, therefore, it has eagerly been desired to develop a process for the synthesis of diamond and an apparatus for practicing this process, wherein a large sized thermoelectron radiation material is provided as an exciting source and a substrate is arranged with a high space efficiency relatively to the thermoelectron radiation material, so that the capacity of the exciting source can be displayed to the maximum, the utility efficiency of a raw material gas in a reaction zone can be increased, the dead zone in a reaction vessel can be decreased and the occupied area of the synthesis apparatus can be reduced per the diamond-forming area, thus obtaining excellent productivity with a compact size of apparatus. The present invention has been made so as to respond to the desirement.

In various synthesis techniques of diamond, the inventors have made various studies to improve the hot filament CVD method and apparatus capable of enlarging the diamond-forming area in relatively easy manner and to utilize effectively the capacity of a thermoelectron radiation material, and consequently, have reached a process and apparatus for producing diamond with excellent productivity as well as a compact size of apparatus, which can be applied to production on a commercial scale. The present invention can thus be accomplished.

DISCLOSURE OF THE INVENTION

Accordingly, the present invention provides a process for the production of diamond comprising subjecting to decomposition, excitation and activation by a thermoelectron radiation material heated at a high temperature a raw material gas comprising at least one carbon source selected from the group consisting of hydrocarbons, hydrocarbons containing oxygens and/or nitrogens in the bonded groups, carbon oxides, halogenated hydrocarbons and solid carbon, hydrogen and optionally any one of inert gases of Group VIII elements, $H_2O$, $O_2$ and $F_2$ and depositing diamond on the surface of a substrate provided near the thermoelectron radiation material, characterized by surrounding the circumference of the thermoelectron radiation material by a cooling plate, providing a substrate to be deposited with diamond between the cooling plate and the thermoelectron radiation material with small gaps and controlling the surface temperature of the substrate facing the thermoelectron radiation material by the cooling plate and optionally a buffer material inserted between the cooling plate and the substrate, thereby depositing diamond, and an apparatus for practicing the process.

BEST EMBODIMENT FOR PRACTICING THE INVENTION

Figure 1A:
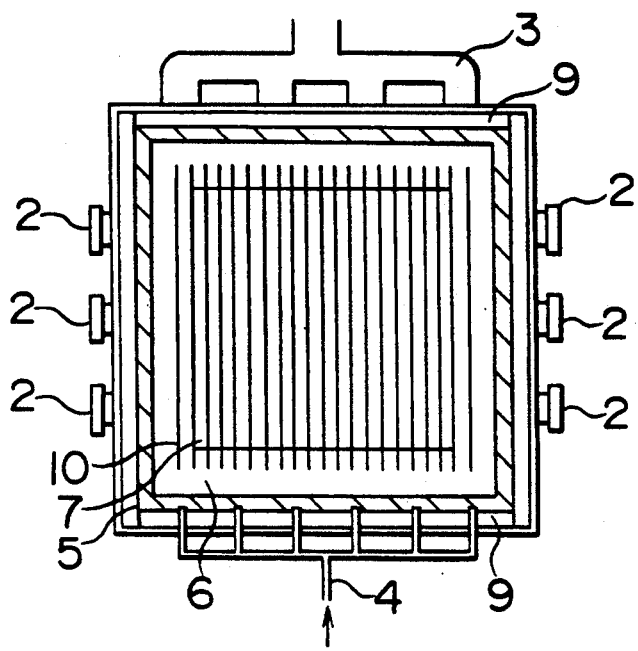
FIG. 1 (a), (b) and (c) are schematic views of one embodiment of the present invention.

As a particularly preferable embodiment of the present invention, there are a process and apparatus for the production of diamond, as described above, in which a wire rod consisting of a high melting point metal, carbon fiber or carbon rod is used as the above described thermoelectron radiation material, a plurality of the thermoelectron radiation materials are vertically stretched in a same plane to form a plane of the thermoelectron radiation materials, cooling plates having substrates to be deposited with diamond, fitted to both the sides thereof, are provided to put the plane of the thermoelectron radiation materials between the cooling plates, the inside of a reaction vessel is so constructed that the above described raw material gas is allowed to flow only in the gap between the two cooling plates substantially facing to each other, and the raw material gas is equally fed to the gap between the faced cooling plates from the lower part of the reaction vessel and exhausted from the upper part.

In another embodiment of the present invention, a raw material gas is blown off against the thermoelectron radiation materials from a plurality of gas feed ports fitted to a cooling plate or buffer material, and when another raw material gas is simultaneously fed from the lower part of the reaction vessel, the other raw material gas having a same or different composition is blown off.

In the present invention, the distance between the above described thermoelectron radiation materials and the surface of a substrate to be deposited with diamond is preferably 40 mm or less, and in order to deposit diamond while controlling the distance between the above described thermoelectron radiation materials and the surface of the substrate to be deposited with diamond correspondingly to the thickness of diamond formed on the surface of the substrate, it is preferable to provide an apparatus having a mechanism for moving a buffer material or cooling plate fitted with the substrate.

In the present invention, diamond can be deposited by the use of an apparatus comprising such a constructive element that a plane formed of the thermoelectron radiation materials is put in between cooling plates each being provided with a substrate to be deposited with diamond, and a plurality of the constructive elements are provided in a reaction vessel.

In a particularly preferable embodiment of the present invention, furthermore, diamond is deposited by using an apparatus comprising a means for forming DC plasma between the thermoelectron radiation materials as a hot cathode and a substrate fitted to the buffer material or cooling plate.

The feature of the present invention will now be illustrated.

Substrates are arranged in the vicinity of thermoelectron radiation materials to put the thermoelectron radiation materials between the substrates from both the sides thereof, which are surrounded by cooling plates, the gaps between the substrates facing each other and the thermoelectron radiation materials are relatively narrow and a raw material gas is substantially flowed through the gaps to cause reaction thereof, whereby diamond is deposited at both the sides of the thermoelectron radiation materials. Thus, the productivity can more be increased as compared with the prior art in which the deposition is carried out only at one side.

A buffer material can be fitted to the cooling plate and a substrate can be fitted to the cooling plate directly or via a buffer material (which will hereinafter be referred to as "substrate-supporting cooling plate" sometimes).

Since the reaction is carried out in the gap formed by the substrate and thermoelectron radiation materials and decreased, particularly preferably to at most 40 mm, and the diamond synthesis conditions can be realized by controlling the surface temperature of the substrate by the cooling plate and optionally the buffer material, the thermoelectron radiation materials can effectively be utilized over a wide range, not in part as usual.

Depending on the shape of the thermoelectron radiation material, a method of surrounding the circumference thereof by substrate-fitted cooling plates is varied, but when using a wire-shaped high melting point metal, carbon fiber or carbon rod as the thermoelectron radiation material, it is rendered possible to surround the circumference of the thermoelectron radiation materials with a large area by the substrate to be deposited with diamond in effective manner and to largely increase the productivity by vertically stretching a plurality of the thermoelectron radiation materials to form a plane of the thermoelectron radiation materials and arranging the cooling plates provided with substrates to be deposited with diamond at both the sides of the plane to put the plane between them. Furthermore, the synthesis conditions of the substrates, arranged at both the sides of the thermoelectron radiation materials, can readily be rendered equal to largely increase the productivity.

Furthermore, the internal structure of a reaction vessel is so constructed that a raw material gas is flowed only through the gap between two cooling plates or substrate-fitted cooling plates, arranged to substantially face each other and to put the plane formed of the thermoelectron radiation materials between the cooling plates from both the sides thereof, and the raw material gas is equally fed to the gap between the faced cooling plates from the lower part of the reaction vessel and exhausted from the upper part thereof. Thus, the dead zone of the reaction vessel can markedly be reduced to give a compact synthesis apparatus and the flow of the raw material gas is rendered uniform from the lower part to the upper part of the reaction vessel to give effective utilization of the raw material gas.

In addition to the construction described above, blow-off holes are provided on the cooling plate or where necessary on the substrate-fixed surface and a carbon source gas or a mixed gas of a carbon source gas with hydrogen is blown off against the thermoelectron radiation materials from the blow-off holes, whereby more uniform formation of diamond is rendered possible on the substrates provided at the upper and lower part of the substrate-supported cooling plate vertically maintained and the synthesis speed of diamond can also be increased.

Provision of a plurality of construction elements for putting the plane formed of the above described thermoelectron radiation materials in between the substrate-supported cooling plates, etc. from both the sides of the plane in a reaction vessel results in remarkable increase of the total quantity of diamond-forming areas by a compact installation.

On the other hand, the inventors have proposed a process for the synthesis of diamond as disclosed in Japanese Patent Laid-Open Publication No. 52699/1989, wherein a DC voltage is applied to thermoelectron radiation materials connected to a negative pole and a substrate to be deposited with diamond, connected to a positive pole, and DC plasma is formed between the thermoelectron radiation materials and the substrate, whereby to utilize thermal activation by the thermoelectron radiation materials and plasma activation by the DC plasma.

In the present invention, using, as a hot cathode, a plane formed of thermoelectron radiation materials and using, as an anode, an electroconductive buffer material inserted in between a substrate and a cooling plate, or a substrate-fitted cooling plate surrounding the plane from both the sides thereof, a DC voltage is applied thereto to form DC plasma between them. Thus, it is found that the synthesis rate of diamond can markedly be increased by applying a DC power of at least 50 W/cm$^3$ per unit area of a space surrounded by substrates provided to face each other at a pressure of more than 50 Torr.

In an installation constructed of a plurality of the above described construction elements in a reaction vessel, it is also possible to simultaneously increase both the growth rate of diamond and the total quantity of diamond-forming areas and to largely increase the quantity of diamond formed by using, as a cathode, thermoelectron radiation materials and using, as an anode, a substrate or a substrate-supported cooling plate and if necessary, an electroconductive buffer material inserted in between the cooling plate and the substrate, applying a DC voltage thereto and thereby forming DC plasma between the thermoelectron radiation materials and the substrate.

In the present invention, the distance between the thermoelectron radiation materials and the surface of the substrate is preferably at most 40 mm. When the distance is small, there arises such a problem that if diamond is grown thick during synthesis thereof, the distance between the thermoelectron radiation materials and the surface of the substrate get smaller and consequently, the synthesis temperature rises at the growth front of diamond to change the synthesis conditions when other conditions are same, resulting in deterioration of the quality of the resulting diamond.

This problem can be solved by providing a mechanism for moving the substrate-supported cooling plate correspondingly to growth of diamond so as to maintain the distance between the thermoelectron radiation materials and the surface of the substrate at a predetermined value, and controlling the cooling capacity of the cooling plate. Thus, thick diamond can be obtained under substantially the same conditions.

According to the present invention, in the hot filament CVD method, thermoelectron radiation materials can be large-sized and a substrate can be arranged at a space position with a high efficiency to the thermoelectron radiation materials as an exciting source, where DC plasma is formed between the thermoelectron radiation materials and substrate. Thus, the space capacity of the exciting source can be exhibited at the maximum of efficiency and the exciting capacity for decomposing and activating a raw material gas can markedly be improved. Accordingly, there can be provided a process and apparatus for the synthesis of diamond, which are excellent in productivity and in which the utility efficiency of a raw material gas is high in the reaction zone, the dead zone in a reaction vessel is small, the occupied area of the synthesis apparatus per diamond-forming area is small and both the diamond-forming area and synthesis rate of diamond are large with a compact apparatus.

The present invention will now be illustrated with reference to the accompanying drawings in detail.

FIG. 1 to FIG. 6 are schematic views of various embodiments for practicing the present invention, in which the same numerals have the same meanings.

Figure 1C:
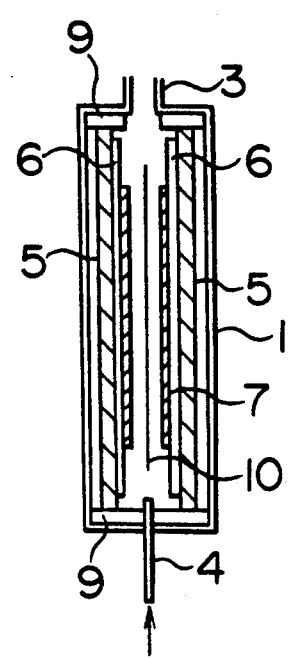
Figure 1B:
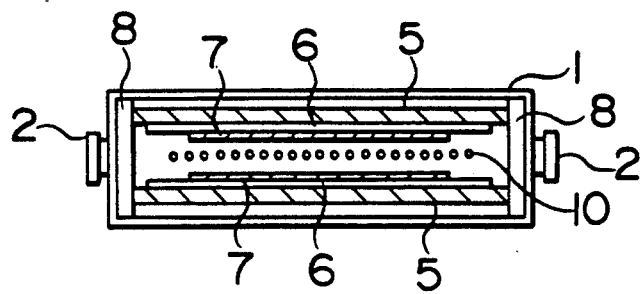

Referring to FIG. 1, (a) is a front view of the apparatus, (b) is a plan view thereof and (c) is a side view thereof, in which 1 designates a reaction vessel and 2 designates viewing windows arranged at the right and left sides.

A raw material gas comprising at least one carbon source of hydrocarbons, hydrocarbons containing oxygen and/or nitrogen in bonding groups thereof, carbon oxides, halogenated hydrocarbons and solid carbon, hydrogen and if necessary, inert gases and any one of $H_2O$, $O_2$ and $F_2$ is introduced from a gas inlet 4 at the lower part of the reaction vessel 1 and divided to be uniformly distributed in the reaction vessel. The reacted gas is exhausted upwards from a divided gas exhaust port 3 to uniformly exhaust the gas. Substrate-supported cooling plates 5, provided at the front side and rear side, can be moved back and forth. 6 designates tray-cum-buffer materials for supporting a substrate 7 provided at the front side and rear side, which function as a means for both fixing the substrate 7 and controlling the cooling capacity and which are fitted to the substrate-supporting cooling plate 5 after providing with the substrate 7. 8 designates cooling plates at the left and right sides and 9 designates cooling plates at the upper and lower parts, which are fitted to the interior wall of the reaction vessel to surround the thermoelectron radiation materials from left and right and from upper and lower. The substrate-supporting cooling plates 5 are arranged in such a manner that the gaps from the cooling plates 8 and 9 are maintained as smaller as possible in order to prevent from gas flowing during reaction in the space between the substrate-supporting cooling plates 5 and the internal wall of the reaction vessel.

Thermoelectron radiation materials 10 are constructed of a large area plane of thermoelectron radiation materials obtained by giving a tension to linear thermoelectron radiation materials (high melting point wire rods, carbon fibers), for example, using a weight, thereby drawing them to maintain the linear shape and stretching them to form a plane consisting of a number of the thermoelectron radiation materials. Each wire rod of the thermoelectron radiation materials 10 is connected to electrodes at the upper and lower parts (not shown).

Figure 2A:
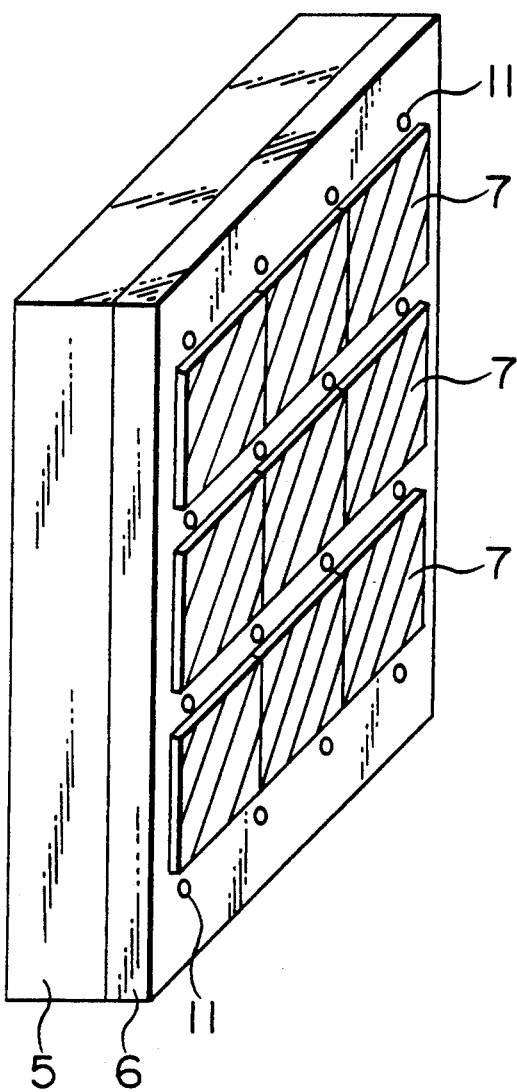
FIG. 2 (a), (b), (c) and (d) are schematic views of another embodiment of the present invention.

FIG. 2 is a schematic view of another embodiment for practicing the present invention, in which (a) is a perspective view of the parts corresponding to 5, 6 and 7 of FIG. 1, the substrate-supported cooling plate 5, the tray-cum-buffer material 6 for supporting the substrate and the substrate 7. (b), (c) and (d) of FIG. 2 are respectively a side view, a view from the substrate-fitted surface and a base view of the tray-cum-buffer material for supporting the substrate. 16 gas blow-off holes 11 are provided and substrates 7 are arranged not to clog the blow-off holes 11. 13 designates a raw material gas feed port to the tray-cum-buffer material for supporting the substrate and 12 designates a groove made, as a gas flow passage, on the contact surface with a cooling plate of the tray-cum-buffer material for supporting the substrate. The depth of the groove 12 is so controlled that a gas is uniformly blown off from the gas blow-off holes 11 (not shown).

The substrate-supporting cooling plate 5 and the tray-cum-buffer material 6 for supporting the substrate are firmly fixed without gap, so that no gas is substantially leaked except from the blow-off holes. The substrate 7 is tightly fixed to the tray-cum-buffer material 6 for supporting the substrate by a fixing means to decrease thermal resistance at the contact boundary as less as possible (not shown).

The method of feeding a gas from the substrate-fitted surface shown in FIG. 2 is not always applied to both the substrate-fitted surfaces faced each other, but when applied to only one side, a large substrate can be arranged since the holes on the one side are not clogged. When a gas is fed from both the substrate-fitted surfaces facing each other, it is desired that the position of blow-off holes on one side and that of blow-off holes on the other side are shifted somewhat each other so as to blow off the gas uniformly against thermoelectron radiation materials.

Figure 3A:
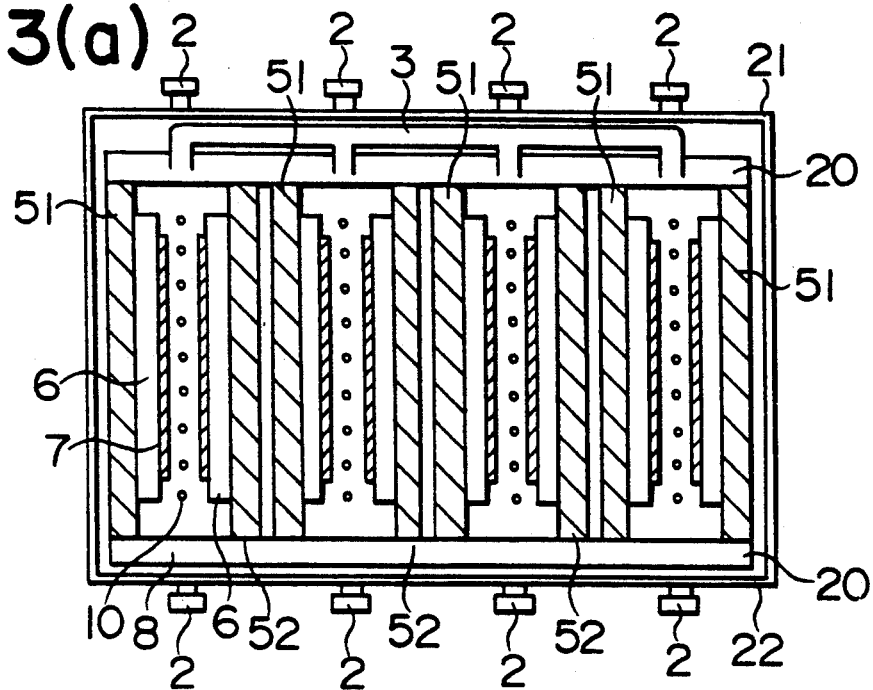
FIG. 3 (a) and (b) are schematic views of a further embodiment of the present invention.
Figure 3B:
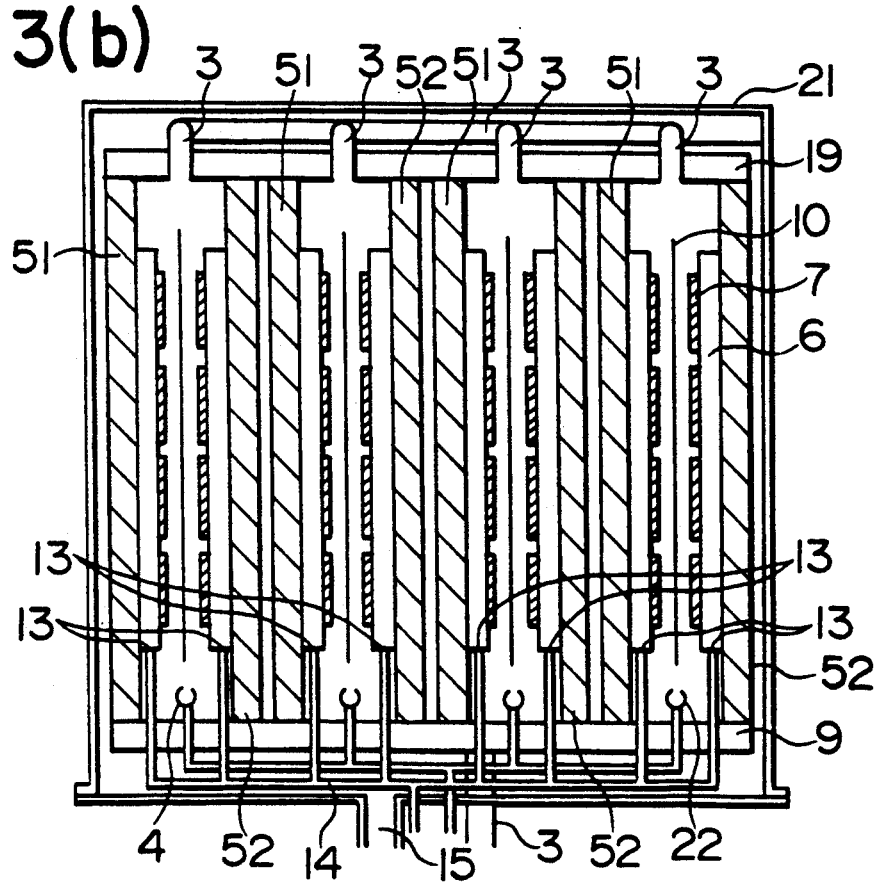
Figure 4:
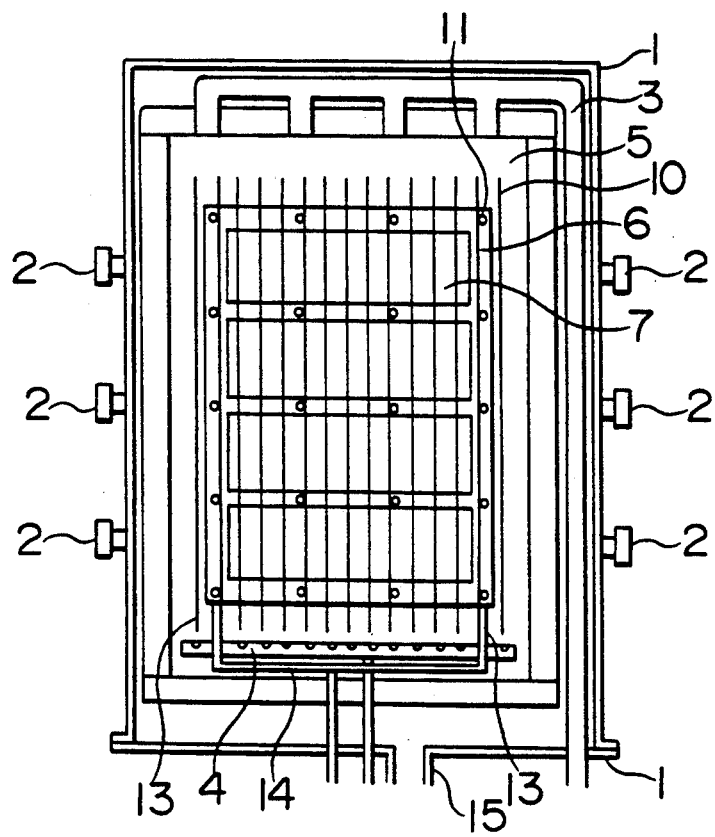
FIG. 4 is a side view of the same embodiment as that of FIG. 3.

FIG. 3 and FIG. 4 are schematic views of a further embodiment of the present invention for practicing the present invention, FIG. 3 (a) being a plan view and (b) being a front view, and FIG. 4 being a side view. This apparatus comprises 4 sets of construction elements in a reaction vessel, the one construction element being so constructed that fundamentally, the both sides of a plane formed of the thermoelectron radiation materials 10 is put in between the cooling plates 5 for supporting the substrates 7.

Feeding of a raw material gas to a reaction vessel 1 is carried out by feeding hydrogen or hydrogen and a carbon source gas and optionally an inert gas of Group VIII element of Periodic Table to a gap between the substrate-supporting cooling plates 51 and 52 supporting the substrates facing each other at both the sides of a plane formed of the thermoelectron radiation materials 10 from a nozzle-like raw material gas feed port 4. In addition, a carbon source gas or a mixed gas of a carbon source gas and hydrogen is fed through a gas feed conduit 14 to a raw material gas feed port 13 to the tray-cum-buffer material 6 for supporting the substrate and then blown off against the thermoelectron radiation materials 10 from a plurality of gas blow-off holes 11, provided on the substrate-supported surface. In FIG. 3, a raw material gas is fed to each reaction space through a common circuit, but it is also possible to supply raw material gases differing in composition to the reaction spaces by providing independent feed circuits every reaction spaces. In this case, diamonds can simultaneously be synthesized under different synthesis conditions in one reaction vessel.

These raw material gases are exhausted upwards from the gas exhaust port 3 provided to be divided to uniformly exhaust the reacted gas in the upper part of each of the reaction spaces. 15 designates a main exhaust port for evacuating the whole of the reaction vessel in high vacuum together with the gas exhaust port 3.

The cooling plates 51 and 52 for supporting the substrates can be moved back and forth against the plane formed of the thermoelectron radiation materials. Correspondingly to growth of diamond, the substrate-supporting cooling plates can be moved to maintain the distance between the thermoelectron radiation materials and the substrate surface at a predetermined value. The tray-cum-buffer material 6 for supporting the substrate has both functions of fixing the substrate 7 and controlling the cooling capacity and after providing the substrate, it is tightly fixed to the substrate-supporting cooling plate 51 or 52 in such a manner that the thermal resistance at the contact boundary is maintained as little as possible. The cooling plates 8 and 9 are respectively provided to surround the substrate-supporting cooling plates 51 and 52. The substrate-supporting cooling plates 51 and 52 should preferably be arranged with a gap from the cooling plates 8 and 9, which is rendered as narrow as possible so that gas flow is not caused in the space between the cooling plates 51 and 52 and the inner wall of the reaction vessel during reaction.

The thermoelectron radiation materials 10 are similar to those of FIG. 1 and have a power source for heating the thermoelectron radiation materials 10 in each of the construction elements (not shown). As the heating power source, there can be used one common power source or respectively independent power sources. In this case, the temperature of the thermoelectron radiation materials can be varied in each of the construction elements and diamond can simultaneously be synthesized under different synthesis conditions in one reaction vessel, thus obtaining diamond differing in quality.

The reaction vessel 1 is constructed of a box-type vessel 21 and a base plate 22. When a substrate is charged or discharged before or after the reaction, the box-type vessel 21 is held up and taken away, then a cooling jacket 19 composing an upper cover is taken away and subsequently, cooling plates 20 in front and rear are removed. Then, the substrate 7 is taken away from the substrate-supporting cooling plates 51 and 52 together with the tray-cum-buffer material 6 for supporting the substrate. Means for supporting the thermoelectronic emission materials 10 is of a cassette type, so exchange of the thermoelectron radiation materials can be done by exchanging a cassette carrying them. The substrate 7 can be set by operation in the reverse order thereto.

Figure 5:
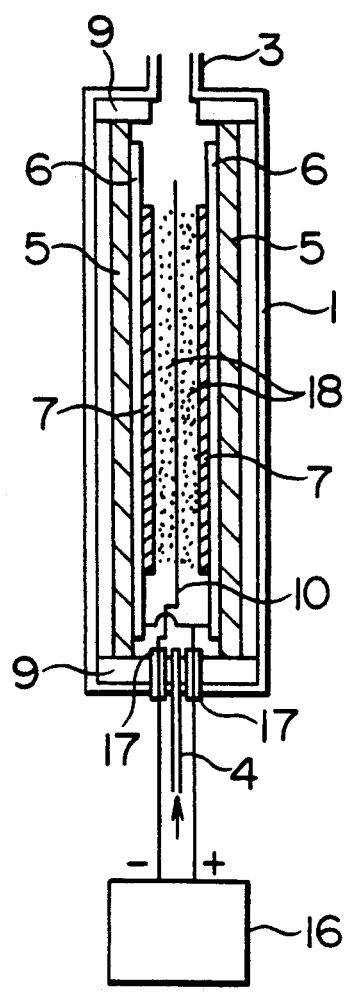
FIG. 5 is a schematic view of a further embodiment of the present invention.

FIG. 5 is a schematic view of a further embodiment for practicing the present invention. This embodiment corresponds to the construction of FIG. 1 (c) to which a DC power source 16 is added by connecting the cathode to the thermoelectron radiation materials 10 and the anode to the tray-cum-buffer material 6 for supporting the substrate, through current feed terminals 17. After heating the thermoelectron radiation materials at a high temperature, a DC voltage is applied using the thermoelectron radiation materials 10 as a hot cathode to form DC plasma 18 mainly between the thermoelectron radiation materials 10 and substrate 7.

Figure 6A:
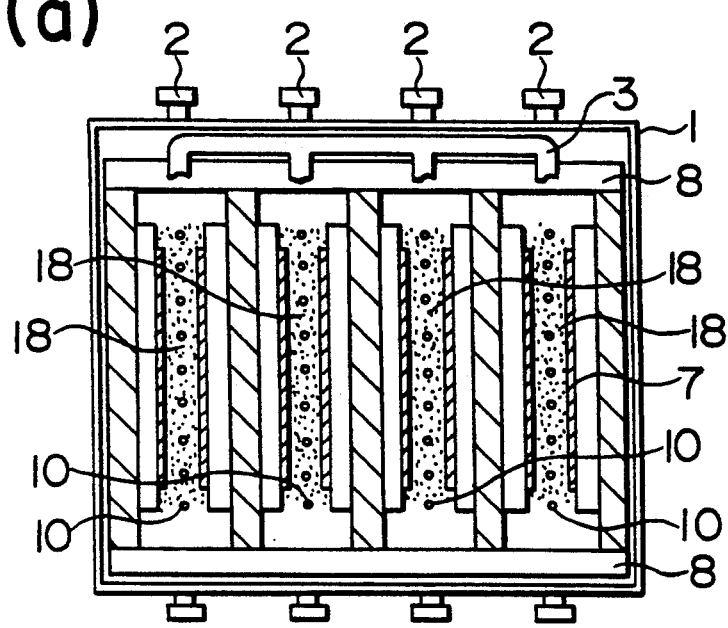
FIG. 6 (a) and (b) are schematic views of a further embodiment of the present invention.
Figure 6B:
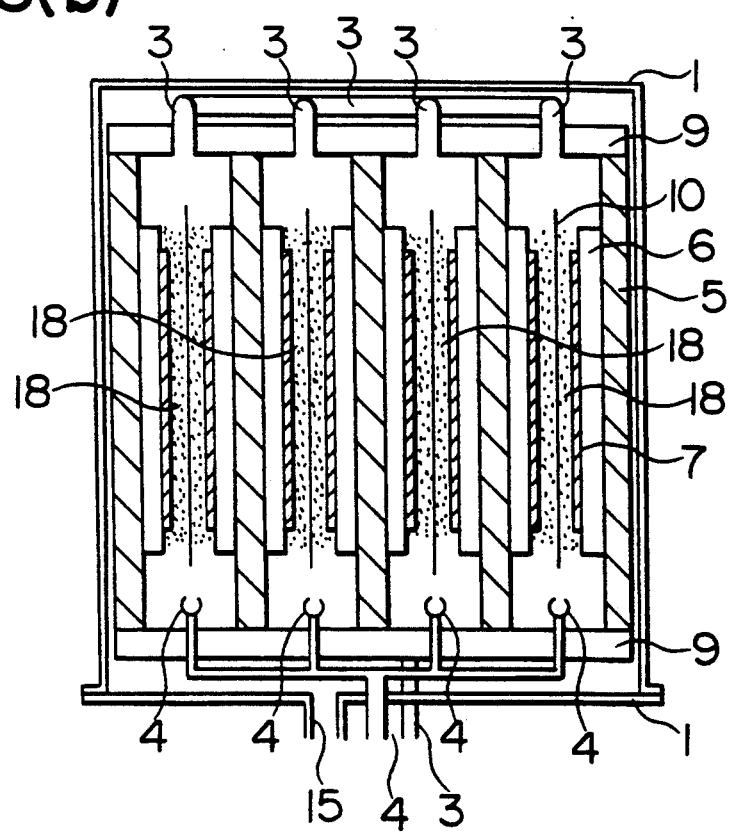
Figure 7:
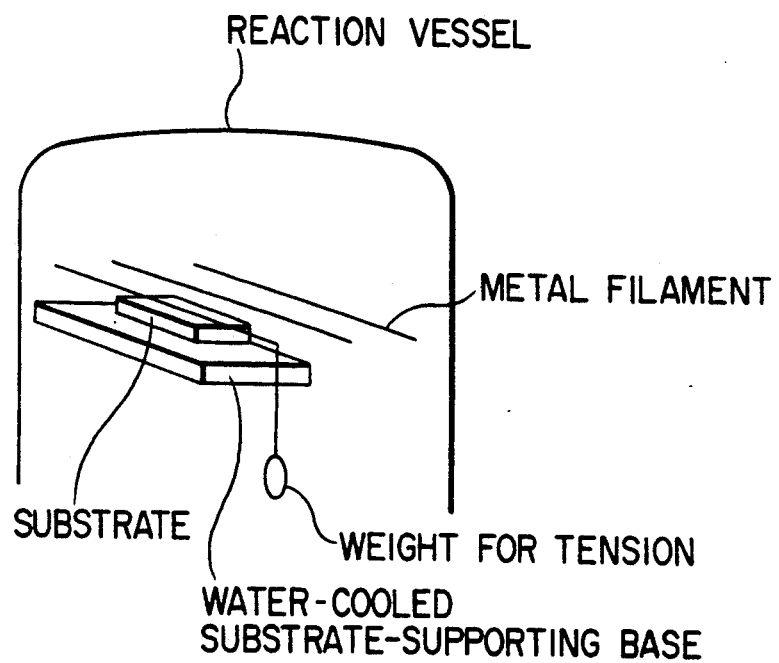
FIG. 7 is a schematic view of one embodiment of the present invention, in which a plurality of filaments under tension are arranged to form a same plane.

FIG. 6 is a schematic view of a still further embodiment for practicing the present invention, (a) being a plan view and (b) being a side view. In this embodiment, there are provided 4 sets of construction elements in a reaction vessel, each of the construction elements being constructed of a plane formed of the thermoelectron radiation materials 10 put in between the substrate-supporting cooling plates 5, as in the case of FIG. 3. Since both the surfaces of the cooling plate 5 for supporting the substrate 7 can be utilized, the construction of this embodiment is more simple and compact than that of FIG. 3. In this case, however, when the cooling plate 5 for supporting the substrate 7 is moved during synthesis, the distance from the thermoelectron radiation materials 10 is varied inside and outside and accordingly, the substrate-supporting cooling plate 5 is not moved during synthesis, in general.

A DC power source (not shown) is also provided as in the case of FIG. 5, while a cathode is connected to the thermoelectron radiation materials 10 and an anode is connected to the tray-cum-buffer material 6 for supporting the substrate, followed by applying a DC voltage to form DC plasma 18.

Each of the construction elements has a power source (not shown) for heating the thermoelectron radiation materials. These heating power sources and DC power sources can use one power source in common or can respectively have independent power sources in the construction elements. When using an independent power source in each of the construction elements, the temperature of the thermoelectron radiation materials and DC plasma conditions can be changed and diamond can thus be synthesized under different synthesis conditions in one reaction vessel, thereby obtaining once diamond with different qualities.

The present invention relates to gaseous synthesis of diamond by the hot filament CVD method or by that jointly using DC plasma. The raw material gas used in the present invention includes a carbon source and hydrogen as essential components. Examples of the carbon source are hydrocarbons such as $CH_4$, $C_2H_2$, $C_5H_8$, etc., hydrocarbons containing oxygen in bonding groups, such as $CH_3OH$, $C_2H_5OH$, $(CH_3)_2CO$, etc., hydrocarbons containing oxygen and nitrogen in bonding groups, such as $CH_3NO$, etc., hydrocarbons containing nitrogen in bonding groups, such as $(CH_3)_2NH$, etc., carbon oxides such as $CO_2$, CO, etc., halogenated hydrocarbons such as $CF_4$, $CH_3F$, etc. and the like. As occasion demands, at least one of inert gases, for example, Group VIII elementary gases of Periodic Table, such as Ar, He, Xe, etc. and $H_2O$, oxygen and $F_2$ can be added. The composition of the raw material gas is not particularly limited, but it is desired that carbon atoms in the carbon source gas are present in a proportion of at most 10% to hydrogen atoms and oxygen atoms are present in a proportion of at most 35% to carbon atoms.

The pressure in the reaction chamber is generally in the range of 1 to 760 Torr, the temperature of the thermoelectron radiation materials is generally in the range of 1600° to 2600° C. and the temperature of the substrate surface is generally in the range of 400° to 1200° C.

In the hot filament CVD method, raw material gases are decomposed and activated by thermoelectron radiation materials heated at a high temperature. Since active species are mainly transported by diffusion in gaseous phase, synthesis of diamond can fundamentally be carried out in all directions round the surface of the thermoelectron radiation material, as a center, if the temperature of the substrate surface is in a correct range. The concentration of the active species becomes higher the nearer they approach the thermoelectron radiation materials and becomes lower the farther they part therefrom.

The distance between the thermoelectron radiation materials and substrate surface is varied depending upon the temperature of the thermoelectron radiation materials, the surface thereof, the pressure of the reaction system, the raw material gases, etc., but it is required that the distance is within a range of at most 40 mm, preferably at most 30 mm, since if larger than 40 mm, the diamond growth rate becomes smaller than 0.5 $\mu$m/hr and no practical diamond growth rate can be obtained. The lower limit of the gap between them is 1 mm.

It is closely related with the shape of the thermoelectron radiation material how to enlarge the area of surrounding the thermoelectron radiation material so as to obtain a large diamond forming area. As the shape of a thermoelectron radiation material with a large area, a plate-like two-dimensional shape or coil-like three-dimensional shape are taken into consideration. However, a thermoelectron radiation material with a three-dimensional shape or constructed three-dimensionally is not suitable so as to satisfy the requirements that the circumference of the thermoelectron radiation material is surrounded by substrates at a same distance from the surface of the thermoelectronic emission material and the distance is precisely controlled. On the contrary, in the two-dimensional plane-like thermoelectron radiation material according to the present invention, substrates can be arranged to put the thermoelectron radiation material between the substrates from both the sides, so that the circumference of the thermoelectron radiation material is surrounded with a very high efficiency and the distance between the thermoelectron radiation materials and the substrate surface can readily be controlled.

As the thermoelectron radiation material, there can be used a large area thermoelectron radiation material obtained by imparting a tension to linear thermoelectron radiation materials to draw and maintain a linear shape and stretching them to form a same plane of a number of wires, as disclosed in Japanese Patent Laid-Open Publication No. 72992/1989, which the inventors have proposed as to enlargement of two-dimensional thermoelectron radiation materials. FIG. 6 shows an example in the case of imparting a tension, for example, by a weight according to this method. In the present invention, this large-sized thermoelectron radiation material is used and put in between substrates facing each other, so that the circumference of the thermoelectron radiation material is surrounded by the substrates in high efficiency. As the thermoelectron radiation material of the present invention, for example, wire rods of high melting point metals such as W, Ta, Re, etc. or carbon fibers can be used. Furthermore, carbon rods with a high temperature strength are formed in a plane and used as a thermoelectron radiation material.

In this construction, substrates facing each other are preferably subjected to same synthesis conditions. There is a difference between a case where a plane containing thermoelectron radiation materials is horizontal and a case where it is vertical. Where a plane containing thermoelectron radiation materials is horizontally arranged, a substrate positioned above the thermoelectron radiation materials is at a higher temperature, due to the effect of convection, than that positioned below them, and the gas flow is different between on the upper substrate and on the lower substrate. On the other hand, where the plane containing thermoelectron radiation materials is vertically arranged, the substrates facing each other are substantially subjected to same synthesis conditions.

In the vertical construction, in particular, a raw material gas can more smoothly be passed through a reaction zone by providing a reaction vessel having such a construction that a raw material gas is flowed through only the gap between two cooling plates substantially facing each other, whereby the raw material gas is uniformly fed from the lower part of the reaction vessel to the gap between the cooling plates facing each other and exhausted from the upper part of the reaction vessel. Since the gas is not fed to other parts than the reaction zone, the reaction gas is used for the reaction effectively. As one example for realizing this embodiment, it is only required that the end of a cooling supporting base, to which a substrate is to be fitted, is fixed to the inner wall of the reaction vessel or the cooling jacket surrounding the same without substantial gap.

In the present invention, a plurality of gas feed ports can be fitted to the substrate-supporting cooling plate or optionally to the buffer material inserted in between the cooling plate and substrate and a carbon source gas or a mixed gas of a carbon source gas and hydrogen gas can be blown off from the blow-off holes opened on the surface to which the substrate is fixed against the thermoelectron radiation materials. This blowing-off can fully be appropriated for feeding of the raw material gas or can jointly be used with the feeding of the raw material gas from the lower part of the reaction vessel as described above. Thus, it is rendered possible to more uniformly form diamond on the substrates provided at the upper part and lower part of the cooling plate for supporting the substrates vertically, and moreover, the synthesis rate of diamond can also be improved.

This is probably due to that when the raw material gas is only fed from the lower part of the reaction vessel to the gap of the substrate-supporting plates, the raw material gases fed differ in composition between at the lower part where the unreacted gas is first fed and at the upper part where the reacted gas by the thermoelectron radiation materials is then fed.

Since in the present invention, an unreacted raw material gas with the same composition can directly and uniformly be supplied from the gas blow-off holes arranged uniformly on the substrate-fixed surface against the thermoelectron radiation materials, uniform synthesis of diamond in the vertical direction is considered to be possible.

Furthermore, it is not always required that the raw material gas fed to the gaps of substrate-supporting cooling plates from the lower part of the reaction vessel and the raw material gas fed from the gas blow-off holes arranged on the substrate-fixed surface are the same in gaseous composition, but rather, the quality of diamond can be controlled by positively changing the gaseous compositions.

For example, high quality diamond with a less content of non-diamond carbon can be synthesized at a high rate by feeding a raw material gas containing no carbon source gas to the gaps of the cooling plates from the lower part of the reaction vessel, or by decreasing the proportion of carbon atoms to hydrogen atoms in the raw material gas to at most 4% and adjusting the proportion of carbon atoms to hydrogen atoms in the raw material gas fed from the blow-off holes arranged on the substrate-fixed surface to at most 10%, larger than in the raw material gas fed to the gaps of the cooling plates from the lower part of the reaction vessel.

On the other hand, when one construction element is constructed of an element comprising substrate-supporting cooling plates holding a plane formed of the thermoelectron radiation materials from both the sides thereof and a plurality of the construction elements are set in a reaction vessel, installation parts such as reaction vessel, evacuation system, gas supplying system, etc. can jointly be used. As a result, the installation can be very compacted and the installation cost can be reduced. When at least one of the raw material gas feed systems, power sources for heating the thermoelectron radiation materials and DC power sources is rendered independent in each of the construction elements, diamond can readily be synthesized under different synthesis conditions, thus obtaining different quality diamonds simultaneously.

As a means for increasing the excitation capacity of a raw material gas of thermoelectron radiation materials, it is considered to raise the temperature of the thermoelectron radiation materials or to increase the surface area thereof, for example, by increasing the number of wires or increasing the size of wires. In order to improve the homogeneity of the excitation source, it is preferable to densely stretch linear filaments.

In order to further improve the excitation capacity of an excitation source, the inventors have proposed a method, as disclosed in Japanese Patent Laid-Open Publication No. 52699/1989, which comprises connecting thermoelectron radiation materials to cathode, connecting a diamond-coated substrate to anode, applying a DC voltage thereto to form DC plasma between the thermoelectron radiation materials and substrates and thereby jointly using thermal activation by the thermoelectron radiation materials and plasma activation by the DC plasma. In the present invention, using a plane formed of thermoelectron radiation materials as a hot cathode and using a substrate to be deposited with diamond, surrounding the plane from both the sides thereof, substrate-supporting cooling plates or optionally an electroconductive buffer material inserted in between the cooling plate and substrate as an anode, applying a DC voltage thereto and thereby forming DC plasma between them. When plasma is formed by the electrode construction according to the present invention, such a large advantage can be obtained that uniform plasma is formed between the electrodes with a large area.

In the present invention, a cathode surface is provided in such a manner that gas is freely passed through the central part of a pair of anode surfaces arranged to face each other, unlike in the ordinary plasma formation of parallel plane system in which a set of a cathode surface and anode surface are faced each other and plasma is formed in a space held between them, and accordingly, the one cathode surface can effectively be utilized, so that plasma be formed in a space with a size of two times as large as the space of the prior art.

The electric power for forming DC plasma is at least 50 W/cm$^3$ and the pressure is in the range of about 50 to 500 Torr.

In any case, since when the excitation capacity of a raw material gas of the excitation source is desired to be improved, the calorific value is markedly increased, it is necessary to cool the substrate so as to maintain the temperature of the substrate surface at 400° to 1200° C., preferably 700° to 1200° C. corresponding to the diamond forming temperature by the ordinary gaseous phase synthesis method.

In the present invention, therefore, a substrate to be deposited with diamond is fitted to a cooling plate and cooled. Thus, the cooling plate must have a sufficiently cooling capacity. When the cooling capacity of the cooling plate is too high to maintain the temperature of the substrate surface within the above described temperature range capable of synthesizing diamond even by controlling the flow rate or temperature of cooling water, it is desirable to insert a buffer material with a low thermal conductivity in between the cooling plate and substrate and to suppress the cooling capacity, thereby controlling the temperature of the substrate surface. Furthermore, the cooling plate should have a large area sufficient to cover the thermoelectron radiation materials and to cut off the heat from the thermoelectron radiation materials.

As the material of the cooling plate in the present invention, there are preferably used materials having high cooling capacity, for example, water-cooled copper jackets, water-cooled stainless steel jackets and copper plates or stainless steel plates with which water-cooled pipes are tightly contacted.

A substrate is directly fitted to a cooling plate or fitted to a cooling plate after fixed to the above described buffer material. During the same time, the fixing must be carried out in such a manner that thermal contact is sufficiently given effect to smoothly conduct heat conduction. Exchange of the substrate can more effectively be carried out by using the buffer material as a tray for fixing the substrate, fitting the substrate thereto outside a reaction vessel and then fixing to the cooling plate, rather than by directly fixing the substrate to the cooling plate. When using a material having a high heat conductivity as the buffer material, this system can be appropriated in a case where it is desired to increase the cooling capacity.

As the buffer material as described above, there can be used materials having high heat conductivity, such as Mo, W, WC-Co, Si, AlN, etc., and materials having low heat conductivity, such as $SiO_2$, etc.

When DC plasma is formed, the use of the buffer material as an anode leads to requirement of selecting a material having electroconductivity at a temperature when it is used.

The material used as the substrate of the present invention includes high melting point metals of forming carbide, i.e. Group VA and VIA metals of Periodic Table and Si, carbides, nitrides and carbonitrides of Group VA and VIA metals of Periodic Table and Si, ceramics obtained by sintering at least one of these carbides, nitrides and carbonitrides with binder materials and carbon substrates having intermediate layers of the above described materials formed.

When DC plasma is formed, it is similarly required to select a material having electroconductivity at the diamond synthesis temperature for the substrate. Above all, Si, SiC, $Si_3N_4$, Mo, W and carbon substrates having an intermediate layer of Si, vapor deposited, are particularly preferable. When using SiC in the case of appropriating DC plasma, doping of Al or N is required, and when using a sintered compact of $Si_3N_4$, it is required to add TiN, thereby imparting electroconductivity.

In the present invention, the distance between the thermoelectron radiation materials and the substrate surface is very important and the thermoelectron radiation materials are held from both the sides thereof by the cooling plates which are respectively independent and have a function of controlling the distance from the thermoelectron radiation materials. In the apparatus shown in FIG. 3, however, the cooling plates 51 and 52 may respectively be moved as a group interlocked closely.

A further advantage of the present invention consists in that the apparatus of the present invention has such a structure that cooling plates each having high cooling capacity surround and enclose thermoelectron radiation materials and the thermoelectron radiation materials having large area can thus be used, so that a large electric power be applied. As to DC plasma, a DC plasma with a high energy density can be formed at a high voltage by applying a large electric power.

Such thermoelectron radiation materials and DC plasma have very high decomposing and activating capacity of a raw material gas. In addition, a raw material gas is fed to only the gap between substrates substantially arranged to face each other and to put filaments in between them, so that the reaction efficiency can largely be increased. Consequently, synthesis of diamond with high quality is rendered possible at a high speed, i.e. several tens μm/hr over a forming zone of a large area.

EXAMPLE 1

Using an apparatus substantially shown in FIG. 1, gaseous synthesis of diamond was carried out. A reaction vessel was very compact as having an inner size of □50 cm×15 cm. As the thermoelectron radiation material, 50 tungsten wires each having a diameter of 0.3 mm and a length of 25 cm, stretched vertically in a same plane, were used. The intervals of the filaments were varied at the end parts and central part in such a manner that the filaments were stretched to be dense at the end parts and to be sparse at the central part and the temperature distribution is thus decreased at the central part and end parts. When the 50 filaments were stretched, their lateral width was 25 cm. As a cooling plate, there was used a water-cooled jacket whose inner reinforcement was sufficiently made by ferrite type stainless steel. As substrates to be deposited with diamond, 32 polycrystal silicon substrates each having a size of 50 mm×50 mm×3 mm t were used and the 4 substrates were laterally arranged in one level on a substrate-supporting tray-cum-buffer material, followed by repeating this arrangement on 4 steps. A surface of a polycrystalline silicon substrate was subjected to a mirror polishing and then to a scratching treatment with diamond powder of NO. 5000. As the tray-cum-buffer material which, after fixing the substrates, was fixed to the cooling plate, a Mo plate with a thickness of 25 mm was used.

As a raw material gas, hydrogen containing 3% by volume of ethanol was used and introduced into the reaction vessel at a flow rate of 6 liter/min. The pressure in the reaction vessel was adjusted to 200 Torr. The filament temperature was adjusted to 2150° C. and the distance between the filament and substrate was controlled, so that the temperature of the substrate surface be 950° C. At that time, the distance was 6 mm. Measurement of the surface temperature was carried out by making a hole in the Mo plate used as a tray, followed by passing a sheath thermocouple through the hole, further making a hole in the silicon substrate, followed by passing a thermocouple through the hole, and measuring the temperature in close vicinity of the surface. Under this condition, the system was maintained for 10 hours to effect synthesis of diamond.

Consequently, diamond with an average thickness of 100 μm could be synthesized at a growth speed of 10 μm/hr. At the same time, the area of the formed diamond was 800 cm² corresponding to a diamond synthesis quantity much larger than that of the prior art apparatus.

The resulting diamond had a very high quality substantially free from amorphous carbon, as represented by the results of Raman spectroscopic analysis that the ratio of the peak height of amorphous carbon and the peak height of diamond was at most 0.05. Furthermore, the full width at half maximum of peak of diamond was 5.5 inverse centimeter, near that of high purity single crystal.

EXAMPLE 2

Using the same apparatus as that of Example 1, i.e. the same reaction vessel, cooling paltes and filaments, and using the tray-cum-buffer material as shown in FIG. 2 (a) to (d), gaseous phase synthesis of diamond was carried out.

As a substrate to be deposited with diamond, there was used a polycrystalline silicon substrate of 50 mm×50 mm×3 mm t, same as that of Example 1, which was subjected to mirror polishing of the surface thereof and then to a scratching treatment with diamond powder of No. 5000. The 4 substrates were laterally arranged in one level on a substrate-supporting tray-cum-buffer material, followed by repeating this arrangement on 4 steps, and the substrate and tray were tightly fixed to reduce thermal resistance. As the substrate-supporting tray-cum-buffer material, a Mo plate with a thickness of 25 mm was used. As a raw material gas to be fed to the gap between the substrate-supporting cooling plates from the lower part of the reaction vessel, hydrogen gas containing 1% by volume of ethanol was flowed at a flow rate of 4.5 liter/min, while as a raw material gas to be fed from blow-off holes arranged on the substrate-fixed surface, hydrogen gas containing 4% by volume of ethanol was flowed at a flow rate of 0.75 liter/min from one substrate-fixed surface, amounting to a sum of 1.5 liter/min. In the similar manner to Example 1, synthesis of diamond was carried out by adjusting the pressure in the reaction vessel to 200 Torr, the filament temperature to 2150° C. and the distance between the filaments and substrate surface to 6 mm, controlling the cooling capacity of the cooling plates to adjust the temperature of the substrate surface to 980° C. and maintaining these conditions for 10 hours.

Thus, diamond with a mean thickness of 150 $\mu$m was fast synthesized at a growth speed of 15 $\mu$m/hr. The quality of the resulting diamond was comparable to that of Example 1. In Example 1, diamonds synthesized at the uppermost steps and lowermost steps of the substrate-supporting tray-cum-buffer material were different in film thickness and the film thickness at the uppermost steps was larger by 15% than that at the lowermost step. On the contrary, in this Example, the thickness difference was suppressed to about 5%.

Diamond could uniformly be synthesized with an improved growth speed in the diamond-forming zone by jointly applying a method of feeding a raw material gas from the blow-off holes arranged on the substrate-fixed surface.

EXAMPLE 3

Using substantially the same apparatus as shown in FIG. 3 and FIG. 4, gaseous synthesis of diamond was carried out. The apparatus was a compact installation including a reaction vessel with an inner dimension of 80 cm width, 65 cm height and 55 cm depth. As the thermoelectron radiation materials, there were used 50 tungsten wires of 0.5 mm in diameter and 30 cm in length, vertically stretched in a same plane in such a manner that the filament gaps are varied at the end parts and central part, i.e. stretched densely at the end parts and sparsely at the central part so as to reduce the temperature distribution between the central part and end parts. When 50 filaments were stretched, the lateral width was 25 cm.

As a cooling plate, there was used a water-cooled jacket whose inner reinforcement was sufficiently made by ferrite type stainless steel. As substrates to be deposited with diamond, polycrystalline silicon substrates each having a size of □50 mm×5 mm t were used. A surface of a polycrystalline silicon substrate was subjected to a mirror polishing and then to a scratching treatment with diamond powder of NO. 5000. The 4 substrates were laterally arranged in one level on a substrate-supporting tray-cum-buffer material, followed by repeating this arrangement on 4 steps, and tightly fixed so as to reduce the thermal resistance between the substrate and tray. As the substrate-supporting tray-cum-buffer material, a Mo plate with a thickness of 15 mm was used. One construction element is constructed of an element comprising substrate-supporting cooling plates holding a plane formed of the thermoelectron radiation materials from both the sides thereof. In each of the construction elements, as a raw material gas to be fed to the gap between the substrate-supporting cooling plates from the lower part of the reaction vessel, hydrogen gas containing 1% by volume of ethanol was flowed at a flow rate of 5 liter/min was used, while as a raw material gas to be fed from the blow-off holes arranged on the substrate-fixed surface, hydrogen gas containing 4% by volume of ethanol was flowed at a flow rate of 1 liter/min, amounting to a sum of 2 liter/min, from one substrate-fixed surface. Synthesis of diamond was carried out by adjusting the pressure in the reaction vessel to 250 Torr, the filament temperature to 2200° C. and the distance between the filaments and substrate surface to 5 mm, controlling the cooling capacity of the cooling plates to adjust the temperature of the substrate surface to 1000° C. and maintaining these conditions for 20 hours.

Thus, diamond with a mean thickness of 400 $\mu$m was fast synthesized at a growth speed of 20 $\mu$m/hr. The quality of the resulting diamond was comparable to that of Example 1 or 2. The formed diamond had an area of 3200 cm$^2$ which was much larger than that formed by the prior art apparatus and furthermore, showed a film thickness distribution within a range of at most 5% in the diamond forming zone and good quality hardly differing therein.

EXAMPLE 4

Using substantially the same apparatus as shown in FIG. 6, gaseous synthesis of diamond was carried out. The apparatus was a compact installation including a reaction vessel with an inner dimension of 70 cm width, 60 cm height and 50 cm depth. As the thermoelectron radiation materials, there were used 44 tungsten wires of 0.5 mm in diameter and 20 cm in length, vertically stretched in a same plane in such a manner that the filament gaps are varied at the end parts and central part, i.e. stretched densely at the end parts and sparsely at the central part so as to reduce the temperature distribution between the central part and end parts. When 44 filaments were stretched, the lateral width was 20 cm.

As a cooling plate, there was used a water-cooled jacket whose inner reinforcement was sufficiently made by a copper alloy. As substrates to be deposited with diamond, low resistance silicon substrates each having a size of □150 mm×10 mm t were used. The surface of the substrate was subjected to a mirror polishing to a scratching treatment with diamond powder of NO. 5000 and then to a roundness treatment of the ridgelines forming the diamond so that DC plasma be not concentrated. One substrate was fitted and tightly fixed to a substrate-supporting tray-cum-buffer material to reduce the thermal resistance between the substrate and tray. As the substrate-supporting tray-cum-buffer material, a Mo plate with a thickness of 10 mm was used.

One construction element is constructed of an element comprising substrate-supporting cooling plates holding a plane formed of the thermoelectron radiation materials from both the sides thereof. In each of the construction elements, hydrogen gas containing 4% by volume of methane was fed at a flow rate of 5 liter/min from the lower part of the reaction vessel to the gap between the cooling plates. Synthesis of diamond was carried out by adjusting the pressure in the reaction vessel to 180 Torr, the filament temperature to 2250° C.

and the distance between the filaments and substrate surface to 5 mm, applying a DC power of 120 W/cm$^3$ per unit volume of the space formed between the substrates facing each other, controlling the cooling capacity of the cooling plates to adjust the temperature of the substrate surface to 980° C. and maintaining these conditions for 10 hours.

Thus, diamond with a mean thickness of 350 μm was fast synthesized at a growth speed of 35 μm/hr. The quality of the resulting diamond was somewhat inferior to that of Example 1, 2 or 3 according to assessment of the Raman spectroscopic analysis method in respect of completeness of diamond, i.e. that the peak strength of diamond was slightly weak and the full width at half maximum was widened. This is probably due to that the diamond is contaminated with W and the internal stress is large. Above all, the problem of the contamination with W can be solved by the use of high purity carbon as the thermoelectron radiation material. Since both the forming area and the forming rate of diamond are large according to this method, the production quantity of diamond can more be increased as compared with the prior art.

It will clearly be understood from these examples that according to the present invention, high quality diamond can be synthesized at a high speed over a wide forming zone in a very compact synthesis apparatus and accordingly, the present invention serves to reduction of the production cost by gaseous phase synthesis method of diamond.

UTILITY AND POSSIBILITY

According to the present invention, there can be provided an apparatus for the synthesis of diamond, which is compact and excellent in productivity and which comprises large-sized thermoelectron radiation materials used as an excitation source in a hot filament CVD method and a reaction vessel in which substrates are arranged with such a high efficiency in a space for the thermoelectronic emission materials that the space capacity of the excitation source can be exhibited to the maximum, the utility efficiency of a raw material gas can be increased in a reaction zone and the dead zone of the reaction vessel can be decreased to reduce the occupied area of the synthesis apparatus per the diamond forming area.

Since in the apparatus of the present invention, a large electric power can be applied to the thermoelectron radiation materials with a large surface area and a large electric power can be applied at a relatively high pressure to form a DC plasma with a high energy density, the decomposition and activation capacity of a raw material gas can be rendered very high. In addition, a raw material gas is fed to only the gap between the substrates substantially facing each other to hold filaments between them, so the reaction efficiency can be rendered very high.

Since one construction element is constructed of an element comprising substrates faced each other to hold filaments between them in a reaction vessel, and a plurality of the construction elements are installed, a diamond-forming zone with a large area can be obtained in a compact apparatus and consequently, high quality diamond can be synthesized over the diamond-forming zone with a large area at a high speed, e.g. several tens μm/hr.

We claim:

1. A process for the production of diamond comprising subjecting to decomposition, excitation and activation, by a thermoelectron radiation material heated at a high temperature, a raw material gas comprising at least one carbon source selected from the group consisting of hydrocarbons, hydrocarbons containing oxygens and/or nitrogens in the bonded groups, carbon oxides, halogenated hydrocarbons and solid carbon, hydrogen and optionally any one of inert gases of Group VIII elements, $H_2O$, $O_2$ and $F_2$ and depositing diamond on the surface of a substrate provided near the thermoelectron radiation material, characterized by surrounding the circumference of the thermoelectron radiation material by a cooling plate, providing a substrate to be deposited with diamond between the cooling plate and the thermoelectron radiation material such that a small gap exists between the substrate and the thermoelectron radiation material and controlling the surface temperature of the substrate facing the thermoelectron radiation material by the cooling plate and optionally a buffer material inserted between the cooling plate and the substrate, thereby depositing diamond.

2. The process for the production of diamond, as claimed in claim 1, in which a wire rod consisting of a high melting point metal, carbon fiber or carbon rod is used as the above described thermoelectron radiation material, a plurality of the thermoelectron radiation materials are vertically stretched in a same plane to form a plane of the thermoelectron radiation materials, cooling plates having substrates to be deposited with diamond, fitted to both the sides thereof, are provided to put the plane of the thermoelectron radiation materials between the cooling plates, the inside of a reaction vessel is so constructed that the above described raw material gas is allowed to flow only in the gap between said cooling plates substantially facing to each other, and the raw material gas is equally fed to the gap between the faced cooling plates from the lower part of the reaction vessel and exhausted from the upper part.

3. The process for the production of diamond, as claimed in claim 1 or 2, in which a raw material gas is blown off against the thermoelectron radiation materials from a plurality of gas feed ports fitted to a cooling plate or buffer material, and when another raw material gas is simultaneously fed from the lower part of the reaction vessel, the other raw material gas having a same or different composition is blown off.

4. The process for the production of diamond, as claimed in claims 1 or 2, in which the distance between the above described thermoelectron radiation materials and the surface of a substrate to be deposited with diamond is at most 40 mm.

5. The process for the production of diamond, as claimed in claims 1 or 2, in which diamond is deposited while controlling the distance between the thermoelectron radiation materials and the surface of the substrate to be deposited with diamond correspondingly to the thickness of diamond formed on the surface of the substrate.

6. The process for the production of diamond, as claimed in claims 1 or 2, in which one constructive element is constructed of a plane formed of the thermoelectron radiation materials, put in between cooling plates each being provided with a substrate to be deposited with diamond, and a plurality of the constructive elements are provided in a reaction vessel, thereby depositing diamond.

7. The process for the production of diamond, as claimed in claims 1 or 2, in which diamond is deposited while forming DC plasma between the thermoelectron radiation materials and a substrate fitted to the buffer material or cooling plate.

8. An apparatus for the production of diamond in which a raw material gas comprising at least one carbon source selected from the group consisting of hydrocarbons, hydrocarbons containing oxygens and/or nitrogens in the bonded groups, carbon oxides, halogenated hydrocarbons and solid carbon, hydrogen and optionally any one of the inert gases of Group VIII elements, $H_2O$, $O_2$ and $F_2$ is subjected to decomposition, excitation and activation by a thermoelectron radiation material heated at a high temperature and diamond is deposited on the surface of a substrate provided near the thermoelectron radiation material, characterized in that the circumference of the thermoelectron radiation material is surrounded by a cooling plate, a substrate to be deposited with diamond is provided between the cooling plate and the thermoelectron radiation material such that a small gap exists between the substrate and the thermoelectron radiation material and the surface temperature of the substrate facing the thermoelectron radiation material is controlled by the cooling plate and optionally a buffer material inserted between the cooling plate and the substrate, thereby depositing diamond.

9. The apparatus for the production of diamond, as claimed in claim 8, in which a wire rod consisting of a high melting point metal, carbon fiber or carbon rod is used as the above described thermoelectron radiation material, a plurality of the thermoelectron radiation materials are vertically stretched in a same plane to form a plane of the thermoelectron radiation materials, cooling plates having substrates to be deposited with diamond, fitted to both the sides thereof, are provided to put the plane of the thermoelectron radiation materials between the cooling plates, the inside of a reaction vessel is so constructed that the above described raw material gas is allowed to flow only in the gap between said cooling plates substantially facing to each other, and the raw material gas is equally fed to the gap between the faced cooling plates from the lower part of the reaction vessel and exhausted from the upper part.

10. The apparatus for the production of diamond, as claimed in claim 8 or 9, in which the cooling plate or buffer material has a plurality of raw material gas feeding ports for blowing off a raw material gas against the thermoelectron radiation material.

11. The apparatus for the production of diamond, as claimed in claims 8 or 9, in which the distance between the above described thermoelectron radiation materials and the surface of a substrate to be deposited with diamond is at most 40 mm.

12. The apparatus for the production of diamond, as claimed in claims 8 or 9, in which a mechanism for moving the cooling plates each being fitted with the substrates is provided to control the distance between the thermoelectron radiation materials and the surface of a substrate to be deposited with diamond.

13. The apparatus for the production of diamond, as claimed in claims 8 or 9, in which a plurality of constructive elements constructed of a plane formed of the thermoelectron radiation materials, put in between cooling plates each being provided with a substrate to be deposited with diamond, are provided in a reaction vessel.

14. The apparatus for the production of diamond, as claimed in claims 8 or 9, in which a means for forming DC plasma between the thermoelectron radiation materials as a hot cathode and cooling plates or buffer materials fitted with substrates to be deposited with diamond, as an anode, is provided.

* * * * *